(12) United States Patent
Daruwalla et al.

(10) Patent No.: US 12,470,177 B2
(45) Date of Patent: Nov. 11, 2025

(54) FEEDBACK TOPOLOGIES FOR AMPLIFIER GAIN REDUCTION

(71) Applicant: pSemi Corporation, San Diego, CA (US)

(72) Inventors: Parvez Daruwalla, San Diego, CA (US); Rong Jiang, San Diego, CA (US); Khushali Shah, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 792 days.

(21) Appl. No.: 17/804,470

(22) Filed: May 27, 2022

(65) Prior Publication Data

US 2023/0387863 A1   Nov. 30, 2023

(51) Int. Cl.
*H03F 1/22* (2006.01)
*H03F 3/195* (2006.01)
*H03F 3/72* (2006.01)

(52) U.S. Cl.
CPC ............. *H03F 1/223* (2013.01); *H03F 3/195* (2013.01); *H03F 3/72* (2013.01); *H03F 2200/294* (2013.01); *H03F 2200/451* (2013.01); *H03F 2203/7212* (2013.01)

(58) Field of Classification Search
CPC ........................................................ H03F 1/22
USPC ................................................ 330/311, 310
See application file for complete search history.

(56) References Cited

U.S. PATENT DOCUMENTS

| | | | | |
|---|---|---|---|---|
| 4,241,316 A | * | 12/1980 | Knapp | H03F 3/165 330/277 |
| 11,728,837 B2 | * | 8/2023 | Ayranci | H03F 3/72 455/193.1 |
| 2007/0182491 A1 | * | 8/2007 | Iikura | H03F 1/34 330/311 |
| 2013/0315348 A1 | | 11/2013 | Tasic et al. | |
| 2019/0341891 A1 | | 11/2019 | Yoo et al. | |
| 2020/0220508 A1 | | 7/2020 | Ayranci et al. | |

FOREIGN PATENT DOCUMENTS

| | | |
|---|---|---|
| CN | 113422583 A | 9/2021 |
| JP | 2015521010 A | 7/2015 |
| KR | 20000041721 A | 7/2000 |

OTHER PUBLICATIONS

International Search Report and Written Opinion issued for International PCT Application No. PCT/US2023/022102 filed on May 12, 2023 on behalf of pSemi Corporation. Mail Date: Aug. 31, 2023. 9 pages.

* cited by examiner

*Primary Examiner* — Henry Choe
(74) *Attorney, Agent, or Firm* — Steinfl + Bruno LLP

(57) ABSTRACT

Feedback methods and devices to reduce gain in RF amplifiers, more in particular LNAs, are disclosed. The described methods are based on providing feedback paths from the drain terminal of one of the LNA cascode transistors to the source terminal of the LNA input transistor, or from the gate terminal of the input transistor to the source terminal of the LNA input transistor. The disclosed methods can be combined with one another or with existing feedback methods to provide further flexibility and improved tradeoffs when designing LNAs for applications having different requirements.

23 Claims, 18 Drawing Sheets

| PARAMETER | NO FEEDBACK (ORIGINAL) | DRAIN TO GATE FEEDBACK FIG. 1 | DRAIN TO SOURCE FEEDBACK FIG. 2 | GATE TO SOURCE FEEDBACK FIG. 3 | COMBINED DRAIN TO GATE AND DRAIN TO SOURCE FEEDBACK (FIGs. 1, 2 AND 5A) | COMBINED DRAIN TO GATE, DRAIN TO SOURCE AND GATE TO SOURCE FEEDBACK (FIGs. 1, 2, 3 AND 5C) |
|---|---|---|---|---|---|---|
| GAIN (S21) | 19.5dB | 14.0dB | 14.0dB | 14.0dB | 0.0dB | 13.0dB |
| REVERSE ISOLATION (S12) | 33.9dB | 23.6dB | 29.9dB | 38.8dB | 28.9dB | 38.8dB |
| NF | 1.0dB | 2.3dB | 1.3dB | 5.78dB | 4.2dB | 1.9dB |
| IIP3 | -8.5dBm | +2.7dBm | -5.2dBm | -2.6dBm | +3.6dBm | +0.2dBm |
| INPUT RETURN LOSS (S11) | 9.8dB | 9.9dB | 8.4dB | 8.9dB | 11.1dB | 8.9dB |
| OUTPUT RETURN LOSS (S22) | 4.9dB | 9.3dB | 7.8dB | 5.5dB | 4.3dB | 8.7dB |

| S1 | S2 | S3 | DRAIN TO GATE FEEDBACK PATH (R1) | DRAIN TO SOURCE FEEDBACK PATH (R2) | GATE TO SOURCE FEEDBACK PATH (R3) |
|---|---|---|---|---|---|
| OFF | OFF | OFF | INACTIVE | INACTIVE | INACTIVE |
| OFF | OFF | ON | INACTIVE | INACTIVE | ACTIVE |
| OFF | ON | OFF | INACTIVE | ACTIVE | INACTIVE |
| OFF | ON | ON | INACTIVE | ACTIVE | ACTIVE |
| ON | OFF | OFF | ACTIVE | INACTIVE | INACTIVE |
| ON | OFF | ON | ACTIVE | INACTIVE | ACTIVE |
| ON | ON | OFF | ACTIVE | ACTIVE | INACTIVE |
| ON | ON | ON | ACTIVE | ACTIVE | ACTIVE |

FIG. 5E

FEEDBACK TOPOLOGIES FOR AMPLIFIER GAIN REDUCTION

TECHNICAL FIELD

The present disclosure is related to methods and devices for amplifier gain reduction, more in particular to feedback topologies implemented in radio frequency (RF) amplifiers (e.g. low noise amplifiers (LNAs) or power amplifiers) to provide more flexibility when designing RF circuits with such amplifiers. Such provided flexibility results in an overall improved performance tradeoff.

BACKGROUND

Multi-gain LNAs are very commonly used in applications like cellular radio frequency front-end (RFFE) and others. Such LNAs are often required to support several gain states during operation. This needs to be done while meeting several performance requirements other than gain such as noise figure (NF), input return loss (S11), output return loss (S22), reverse isolation (S12), Input Third Order Intercept Point (IIP3), stability etc. Depending on the application, the requirement imposed on each of such parameters may largely vary.

Generally, changing the amplifier gain in RF amplifiers such as LNAs may be performed in various ways such as attenuation, deQing (degrading the quality factor of) the load, reduction of current or bias, and feedback, each method providing its own pros and cons.

A resistive feedback topology is known to provide reduction in gain by providing a programmable resistive path from the output (e.g. the drain-terminal of a transistor in the amplifier) to the input (e.g. the gate-terminal of the input transistors) of the amplifying device. Varying the resistance value in the feedback path allows for gain adjustment. However, in this approach, and when operating with reduced gains, the input-output isolation may degrade and as a result, the S12 parameter (power transferred from the output port to the input port, also known as reverse transmission or isolation) will often suffer considerably and may not meet the corresponding stringent requirement, and may result in undesirable oscillatory conditions, or instability.

In view of the above, providing multiple gain levels while maintaining the overall performance requirements (e.g., also meeting the S12 requirement) for a broad range of RF applications imposes design challenges when implementing LNAs (or, more generally, amplifiers such as power amplifiers).

SUMMARY

The disclosed methods and devices address the above-mentioned challenges by providing further flexibility when designing amplifiers for various RF applications with different performance requirements.

According to a first aspect of the disclosure, a radio frequency (RF) amplifier is provided, comprising: one or more transistors being serially connected, wherein a first transistor of the one or more transistors is configured to receive a first input signal from a first input terminal; and a first feedback path including a first programmable resistor coupling a drain terminal of a transistor of the one or more transistors to a source terminal of the first transistor of the one or more of transistors.

According to a second aspect of the disclosure, a radio frequency (RF) amplifier is provided, comprising: one or more transistors being serially connected, wherein a first transistor of the one or more transistors is configured to receive a first input signal from a first input terminal; and a first feedback path including a first programmable resistor coupling a gate terminal of the first transistor to a source terminal of the first transistor.

According to a third aspect of the disclosure, a method of reducing gain in a radio frequency (RF) amplifier is disclosed, the method comprising: providing one or more transistors being serially connected; applying an input signal to a gate terminal of a first transistor of the one or more transistors; providing a first feedback path including a first programmable resistor, the first feedback path coupling a drain terminal of a transistor of the one or more transistors to the gate terminal of the first transistor; providing a second feedback path including a second programmable resistor, the second feedback path coupling the drain terminal of the transistor to a source terminal of the first transistor; providing a third feedback path including a third programmable resistor, the third feedback path coupling the gate-terminal of the first transistor of the one or more transistors to the source-terminal of the first transistor of the one or more transistors; selectively switching in and out one or more of the first, second, and the third feedback paths based on a set requirement, and further adjusting the gain by varying one or more of the first, second, and the third programmable resistors Further aspects of the disclosure are provided in the description, drawings and claims of the present application.

DESCRIPTION OF THE DRAWINGS

FIG. 4 shows a table summarizing the performance of exemplary feedback methods according to embodiments of the present disclosure.

FIG. 5E shows an exemplary table summarizing the states of feedback paths as a function of switch states in FIG. 5D.

Like reference numbers and designations in the various drawings indicate like elements.

DETAILED DESCRIPTION

Figure 1:
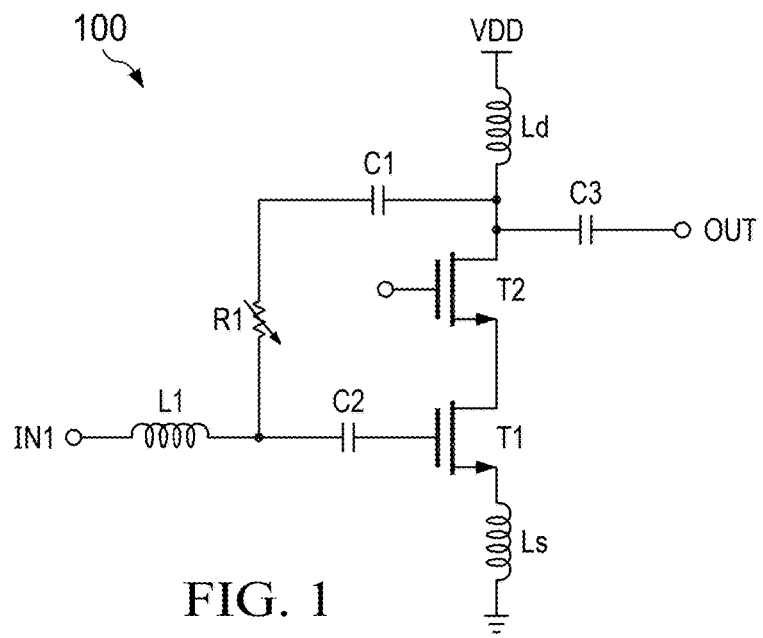
FIG. 1 shows a low noise amplifier (LNA) implementing feedback.

FIG. 1 shows an LNA (100) comprising cascode transistors (T1, T2), input terminal (IN1), output terminal (OUT), and programmable resistor (R1). LNA (100) further comprises direct current (DC) blocking capacitors (C1, C2, C3, inductor (L1) coupling input terminal (IN1) to the gate terminal of transistor (T1), inductor (Ls) coupling the source terminal of transistor (T1) to ground, and inductor (Ld) coupling power supply (VDD) to the drain terminal of transistor (T2). Transistors (T1, T2) are arranged in common-source and common-gate configurations respectively.

The gain of LNA (100) can be adjusted by varying the programmable resistor (R1). The smaller the resistance of programmable resistor (R1), the larger the negative feedback (or loop gain) and therefore, the lower the resulting amplifier gain will be. As mentioned previously, when varying the feedback to adjust for the desired gain, other performance parameters may be undesirably impacted. As an example, when operating at reduced gains (i.e. more feedback), the reverse isolation (S12) may suffer and not meet the requirements anymore. According to an embodiment of the present disclosure, capacitors (C1, C3) may also be used for input and output matching.

In what follows, exemplary embodiments of the present disclosure will be presented. As will be discussed in more detail, such embodiments provide more flexibility in terms of design tradeoffs required for different applications with varying performance requirements.

Figure 2:
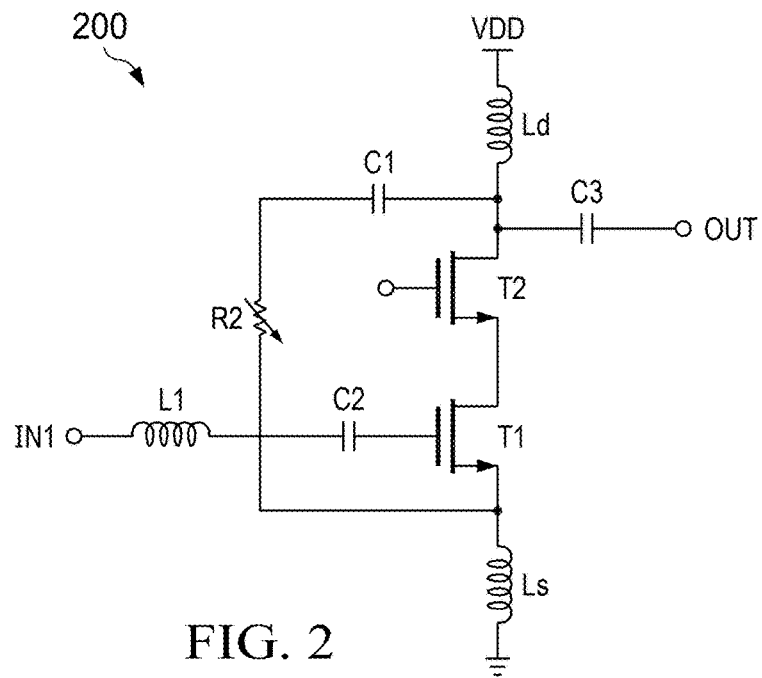
FIGS. 2-3 show exemplary LNAs according to various embodiments of the present disclosure.

FIG. 2 shows an exemplary LNA (200) according to an embodiment of the present disclosure. The principle of operation of LNA (200) is similar to what was described with regards to LNA (100) of FIG. 1, except that the feedback path, through programmable resistor (R2), is now from the drain terminal of transistor (T2) to the source terminal of transistor (T1). According to the teachings of the present disclosure, with this topology and compared to the case of LNA (100) of FIG. 1, when in reduced gain, the degradation of the reverse isolation (S12) and NF are smaller while other performance parameters are not degraded. This will be further clarified later through some examples.

Figure 3:
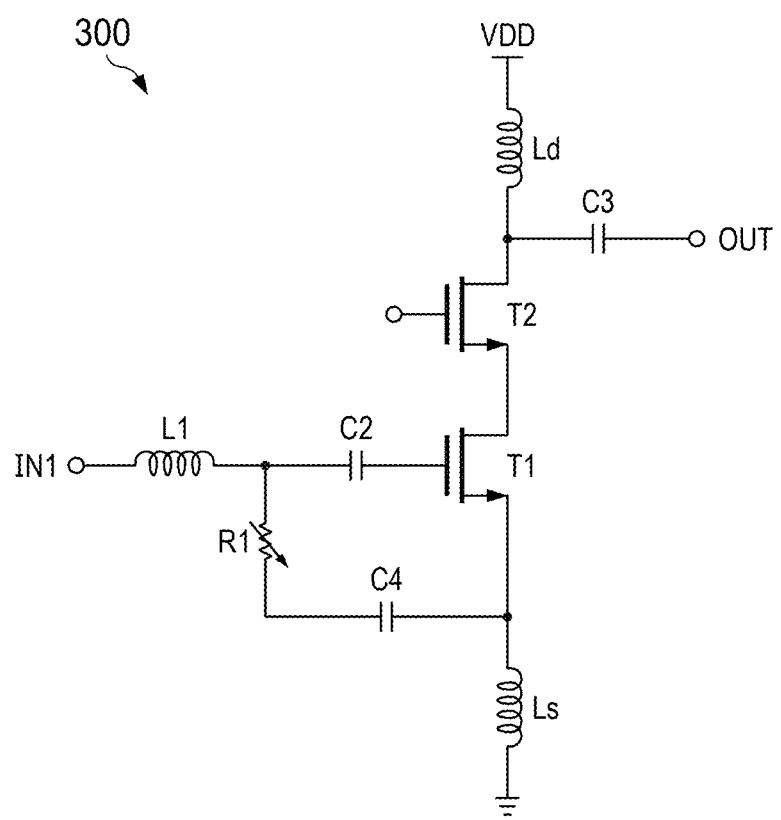

FIG. 3 shows an exemplary LNA (300) according to a further embodiment of the present disclosure. The principle of operation of LNA (300) is similar to what was described with regards to LNA (100) of FIG. 1, except that the feedback path, through programmable resistor (R3), is now from the gate terminal of transistor (T1) to the source terminal of transistor (T1). Also shown is a capacitor (C4) between variable resistor (R1) and inductor (Ls).

FIG. 4 shows an exemplary table (400) according to the teachings of the present disclosure, the table summarizing the comparison between the disclosed feedback topologies and the one shown in FIG. 1. The second column of the table (400) shows exemplary performance parameter values in the case where no feedback is applied. On the other hand, columns 3-5 show exemplary performance parameter values in the case of feedback topologies as shown in FIGS. 1-3 respectively. As shown, when no feedback is implemented, the gain is 19.5 dB. As also shown in table (400), by implementing the feedback topologies as shown in FIGS. 1-3, the gain is reduced to 14 dB. Comparing now the performance parameter values of the third and the fourth column, it can be noticed that by implementing the feedback topology of FIG. 2, less degradation of NF and reverse isolation (S12) will result in compared to the feedback topology as shown in FIG. 1. This comes at the price of slightly less improvements of IIP3, output return loss (S22) and input return loss (S11). Moreover, comparing the fifth column with again the third column, it can be concluded that the feedback topology of FIG. 3 provides an improved reverse isolation (S12) over the other feedback topologies. However, this comes with the caveat of more degradation of NF and slightly more degradation of (S11, S22) over the feedback topology of FIG. 1. It is appreciated that by virtue of providing more options for the design, the teachings of the present disclosure offer more tradeoff flexibility and improved performance tradeoffs when designing for applications with broader range of requirements. The performance parameter values shown in table (400) of FIG. 4 are exemplary numbers and different embodiments may result in different numbers.

Figure 5A:
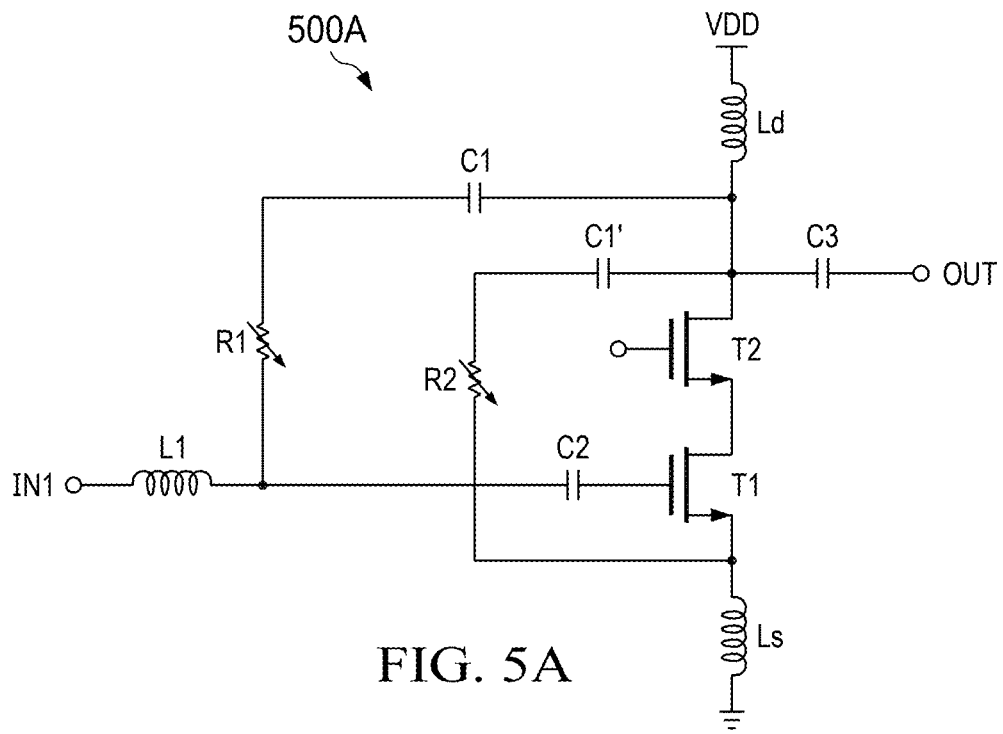
FIGS. 5A-5D show exemplary LNAs according to embodiments of the present disclosure.

In some embodiments, the feedback topologies as shown in FIGS. 1-3 may be combined to offer even further design options and flexibility. FIG. 5A shows an exemplary LNA (500A) according to an embodiment of the present disclosure. As can be noticed, a combination of the feedback topologies previously shown in FIGS. 1 and 2 is implemented in the LNA (500A) where a first feedback path is provided through the programmable resistor (R1) coupling, through DC blocking capacitor (C1), the drain terminal of transistor (T2) to the gate terminal of transistor (T1), and a second feedback path is provided through programmable resistor (R2) coupling, through DC blocking capacitor (C1'), the drain terminal of transistor (T2) to the source terminal of transistor (T1). Exemplary performance parameter values of this feedback topology are shown in the sixth column of table (400) of FIG. 4. As can be noticed, the disclosed combination of two previously shown feedback topologies will provide improved IIP3 and input return loss (S11) which was not the case where each feedback topology was implemented separately. Moreover, it can also be noticed, in the feedback topology shown in FIG. 5A, that the reverse isolation (S12) also experiences less of degradation compared to, for example, the case where the feedback topology of FIG. 1 is implemented.

Figure 5B:
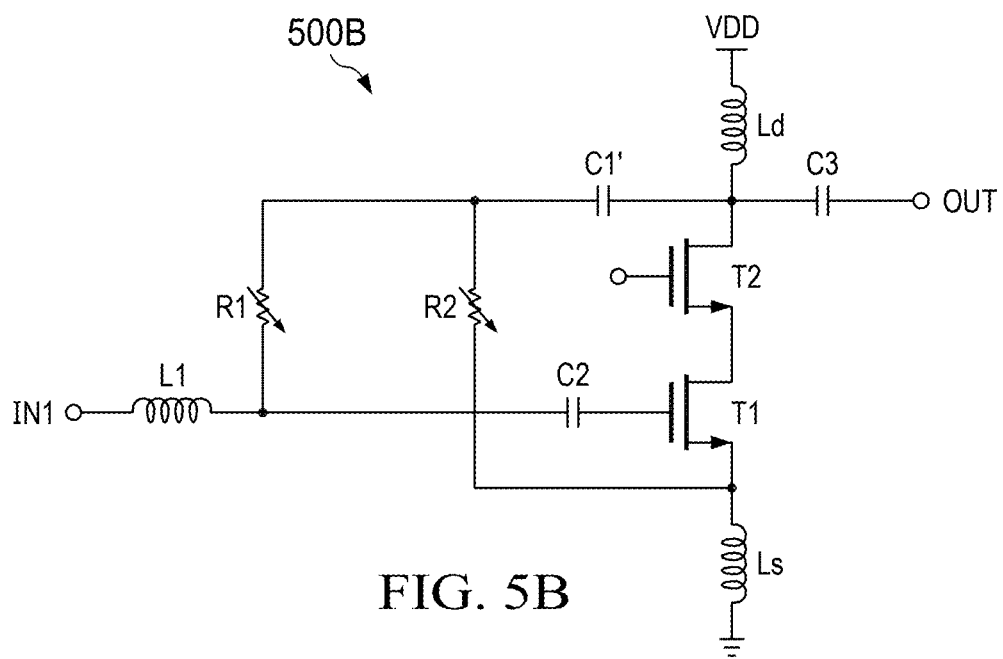

FIG. 5B shows an exemplary LNA (500B) according to a further embodiment of the present disclosure. LNA (500B) is similar to LNA (500A) of FIG. 5A, except that the two feedback paths through resistors (R1, R2) share now a DC blocking capacitor (C1'). This has the benefit of occupying less space (three overall DC blocking capacitors instead of four) in the overall design.

Figure 5C:
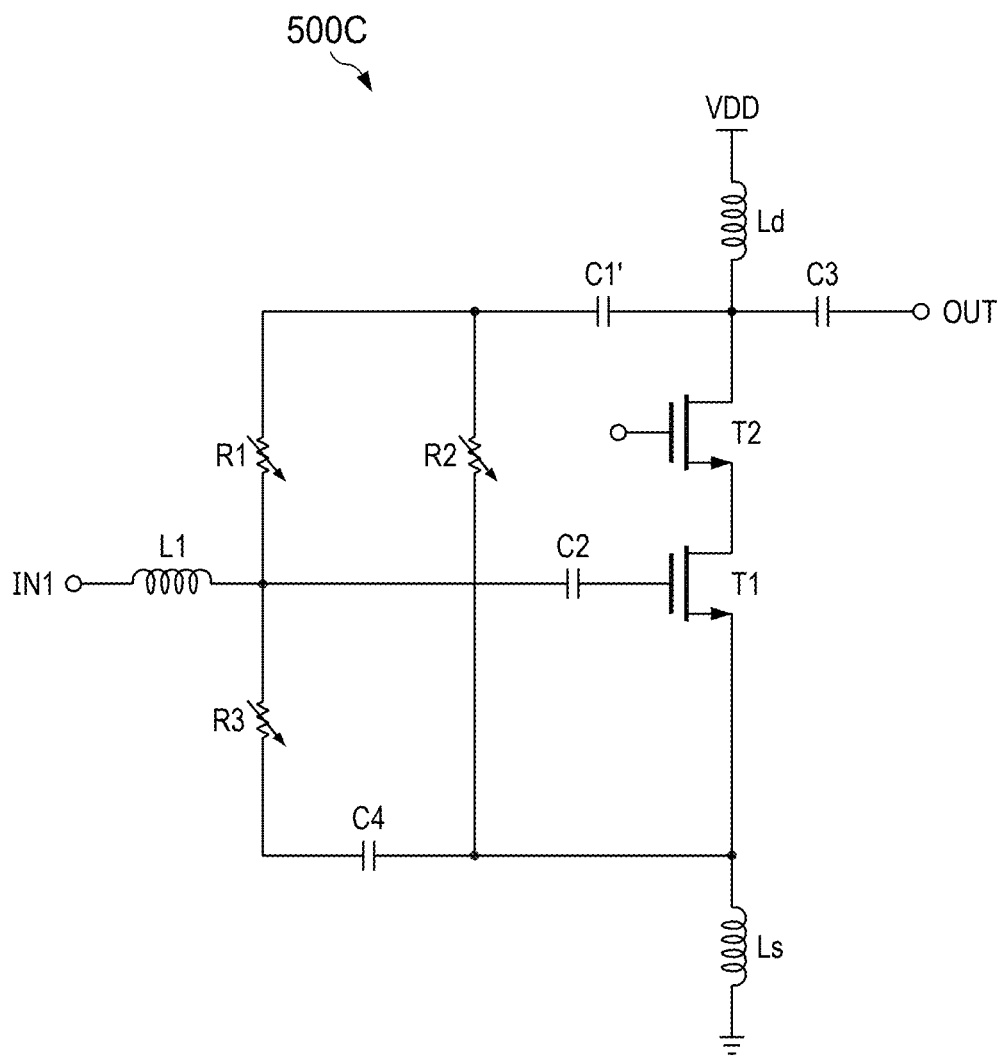

FIG. 5C shows an exemplary LNA (500C) according to another embodiment of the present disclosure. As can be noticed, a combination of the feedback topologies of FIGS. 1-3 is implemented in the LNA (500C) where a first feedback path is provided through the programmable resistor (R1) coupling, through DC blocking capacitor (C1'), the drain terminal of transistor (T2) to the gate terminal of transistor (T1), a second feedback path is provided through programmable resistor (R2) coupling, through the same DC blocking capacitor (C1'), the drain terminal of transistor (T2) to the source terminal of transistor (T1), and a third feedback path is provided coupling, through programmable resistor (R3) and DC blocking capacitor (C4), the gate terminal of transistor (T1) to the source terminal of transistor (T1). Exemplary performance parameter values of this feedback topology are shown in the seventh column of table (400) of FIG. 4. As shown, such feedback topology may be used in applications where NF and reverse isolation (S12) are more critical than other performance parameters.

Figure 5D:
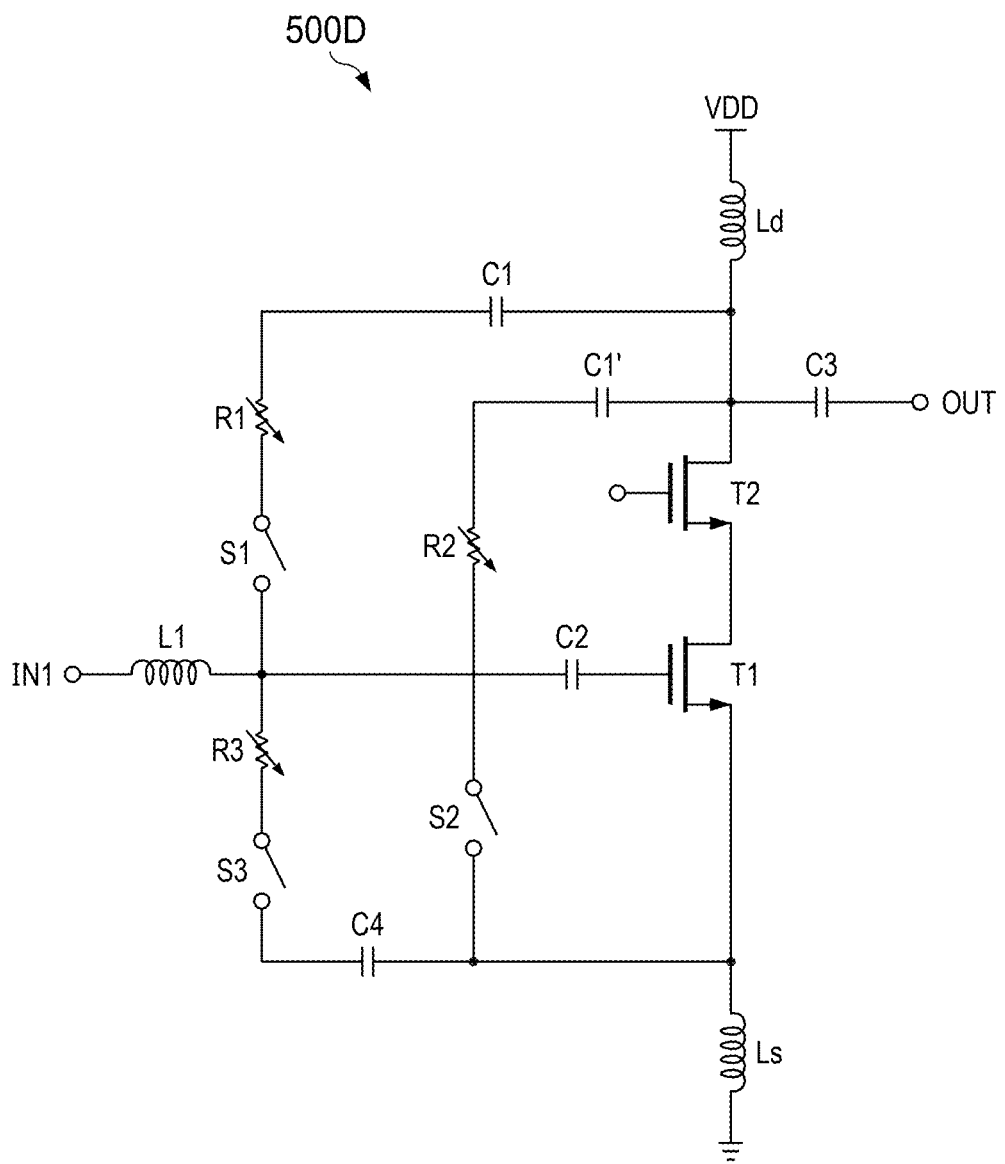

As described above, depending on the application and related requirements, one or a combination of two or more of the disclosed feedback topologies may be implemented. As such, further embodiments may also be envisaged wherein one or more feedback paths may be selectively switched in or out depending on the priorities and importance associated with various performance parameters in specific gain modes of the amplifier for specific applications. FIG. 5D shows an exemplary LNA (500D) according to an embodiment of the present disclosure. The principle of operation of LNA (500D) of FIG. 5D is similar to what was described with regards to LNA (500C) of FIG. 5C except that the feedback paths through programmable resistors (R1, R2, R3) are switchable through switches (S1, S2, S3)

respectively. Depending on the status of switches (S1, S2, S3), none, one or more of the feedback paths can be activated. This will give the designer more flexibility to address different applications with conflicting requirements using practically the same design.

FIG. 5E shows an exemplary table (500E) illustrating the status (i.e. active/switch on or inactive/switch off) of the feedback paths shown in FIG. 5D depending on the states of the switches (S1, S2, S3). As an example, when switches (S1, S2) are in ON state (closed), and switch (S3) is in OFF state (open), the feedback paths through programmable resistors (R1, R2) are active and the feedback path through programmable resistors (R3) is inactive. With reference to table (400) of FIG. 4, and continuing with the same example, this feedback topology is suitable for the applications requiring better reverse isolation (S12). However, in this case and for the same application, the resulting NF (e.g. 4.2 dB) may not be enough to meet the corresponding requirements. In order to overcome this issue, switch (S3) may be controlled to be in ON state (closed) to achieve, as also shown in table (400) of FIG. 4, an improved NF (e.g. 1.9 dB) while maintaining the reverse isolation (S12) at an acceptable value.

Figure 6:
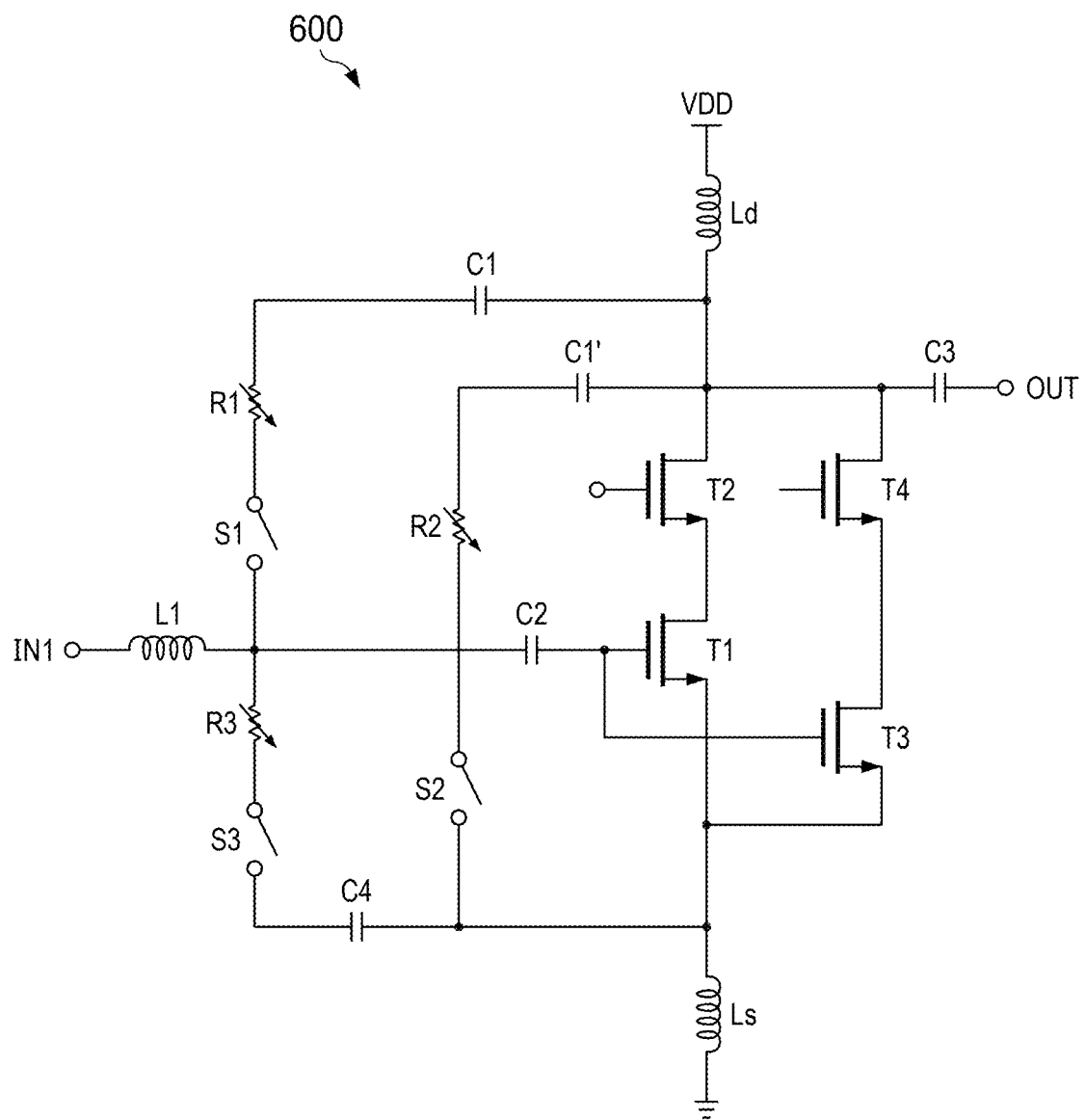
FIG. 6 shows an exemplary LNA according to an embodiment of the present disclosure.

FIG. 6 shows an exemplary LNA (600) according to yet another embodiment of the present disclosure. This is an embodiment showing the application of the disclosed teachings to the case where the LNA includes more than one branch. LNA (600) comprises a first branch including transistors (T1, T2) and a second branch including transistors (T3, T4). The principle of operation of LNA (600) of FIG. 6 is similar to what was described with regards to LNA (500D) of FIG. 5D, except that LNA (600) includes two branches instead of one. The disclosed teachings are applicable to LNAs having an arbitrary number of branches.

Figure 7A:
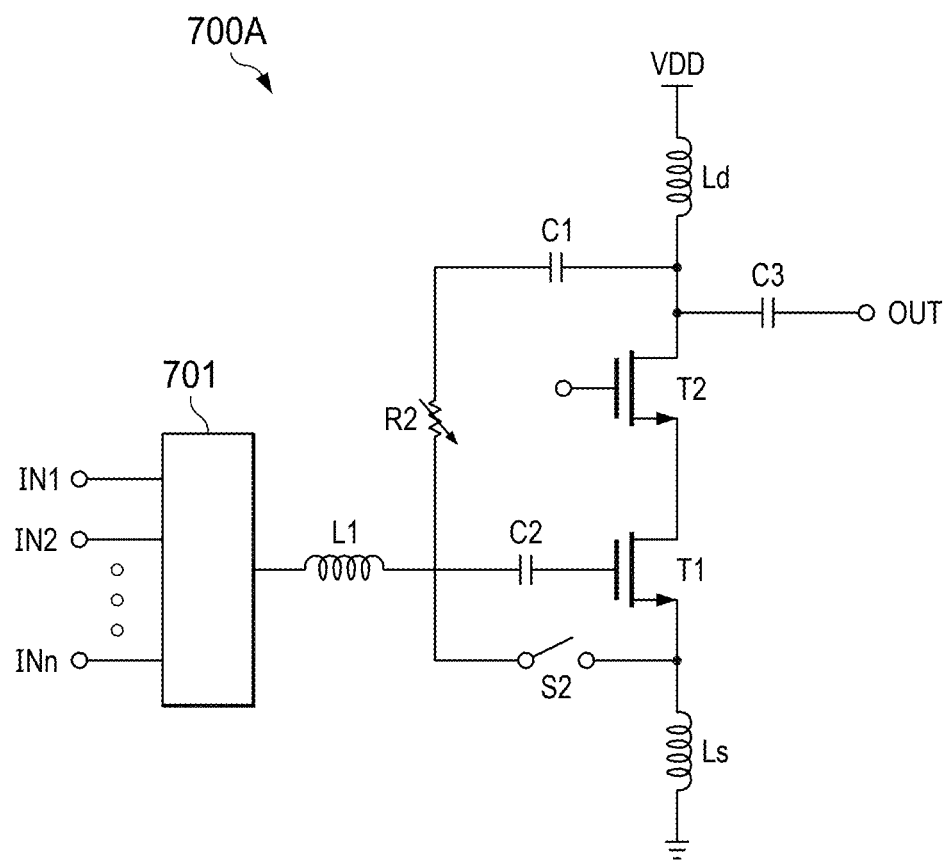
FIGS. 7A-7D show exemplary switched input LNAs according to embodiments of the present disclosure.

The disclosed methods and devices are also applicable to the arrangements implementing switched LNAs. FIG. 7A shows an exemplary LNA (700A) according to an embodiment of the present disclosure. LNA (700A) is a switched LNA receiving one of the inputs (IN1, . . . , INn) depending on the selected input band, where n is an integer greater than one. The selection of the input band is performed through band switch (701). The rest of the circuit downstream from band switch (701) is similar to LNA (200) of FIG. 2 except that the feedback path through programmable resistor (R2) can be switched in or out through switch (S2).

Figure 7B:
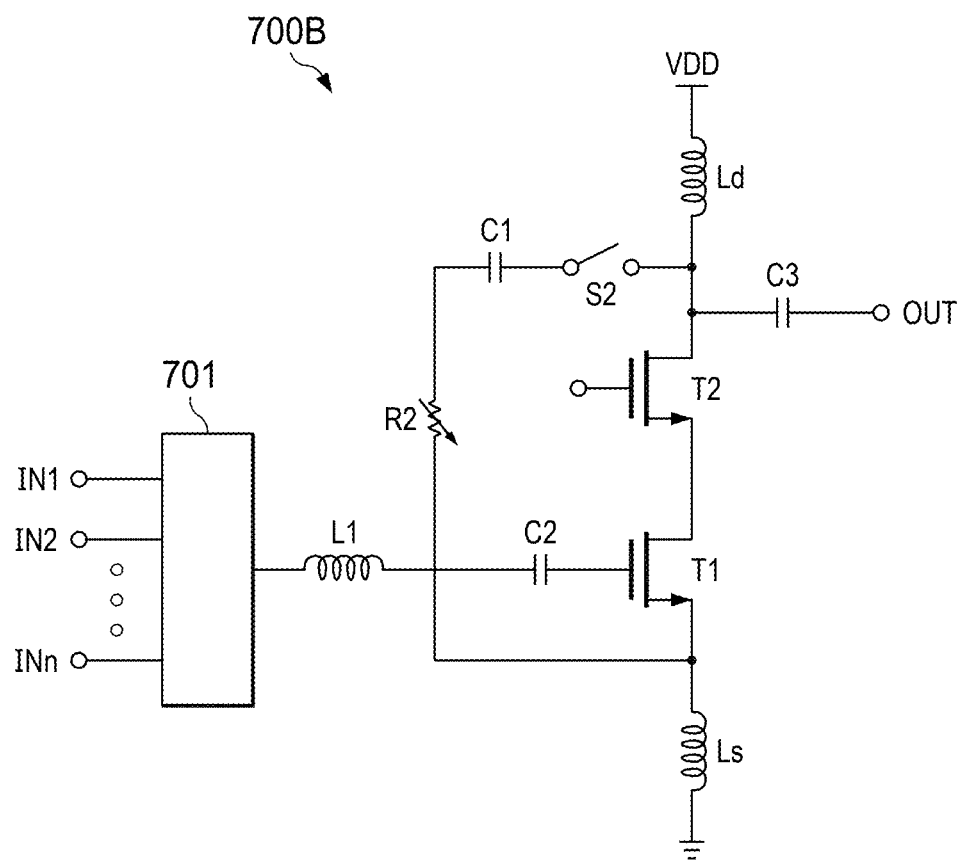

FIG. 7B shows an exemplary LNA (700B) according to an embodiment of the present disclosure. The principle of operation of LNA (700B) of FIG. 7B is similar to the one described above with regards to LNA (700A) of FIG. 7A, except that switch (S2) is now implemented closer to the drain terminal of transistor (T2) instead of the source terminal of transistor (T1). The location where switch (S2) is disposed depends on the desired isolation and the overall layout of the circuit. In another embodiment, two switches within the feedback path, one closer to drain terminal of transistor (T2) and the other one closer to the source terminal of transistor (T1) may be implemented for improved isolation.

Figure 7C:
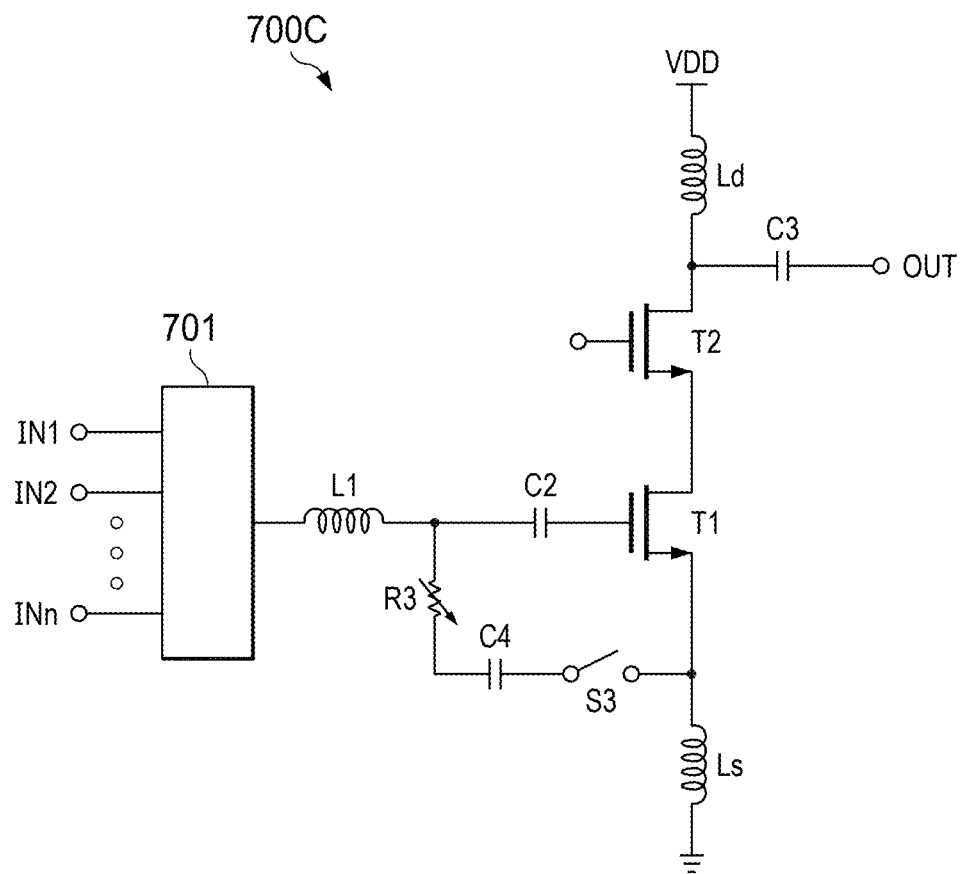

FIG. 7C shows an exemplary LNA (700C) according to an embodiment of the present disclosure. This is another example demonstrating the application of the disclosed feedback topologies to switched LNAs. Similar to the embodiment of FIG. 7B, LNA (700C) receives one of the inputs (IN1, IN2, IN3) depending on the desired band selected through band switch (701). The rest of the circuit downstream from band switch (701) is similar to LNA (300) of FIG. 3 except that the feedback path through programmable resistor (R3) can be switched in or out through switch (S3).

Figure 7D:
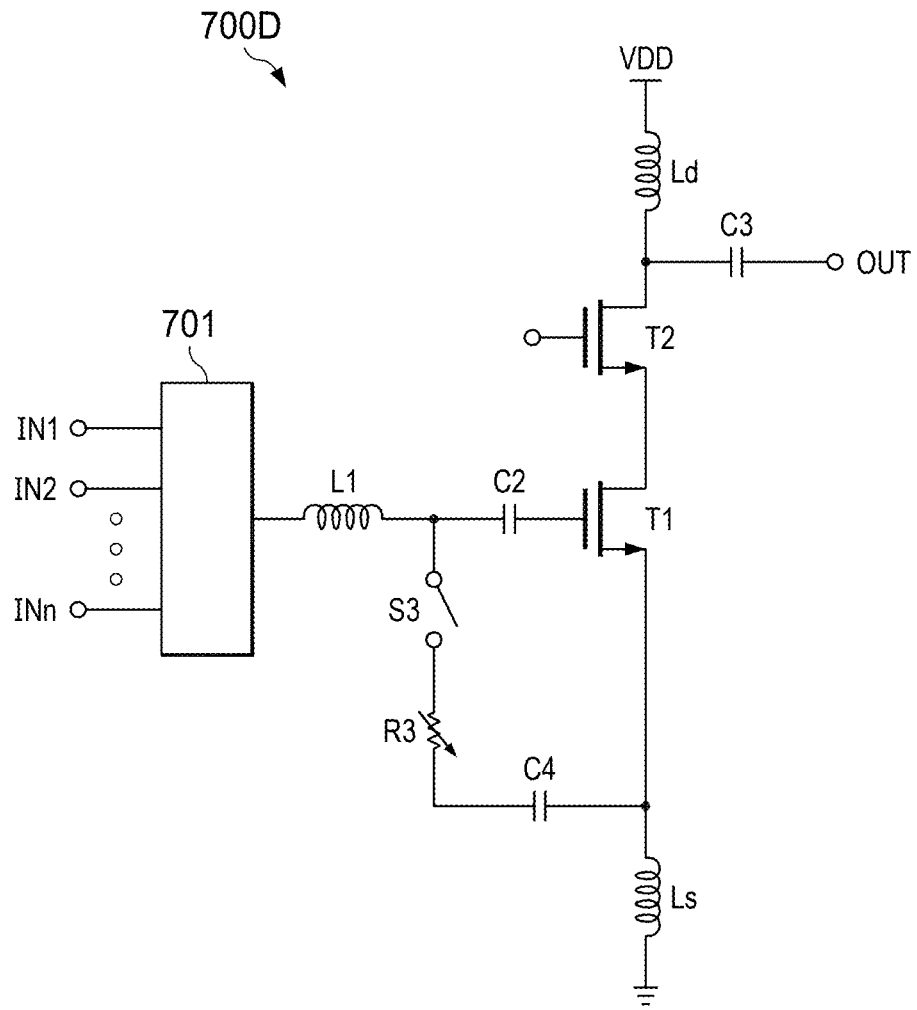
Figure 8A:
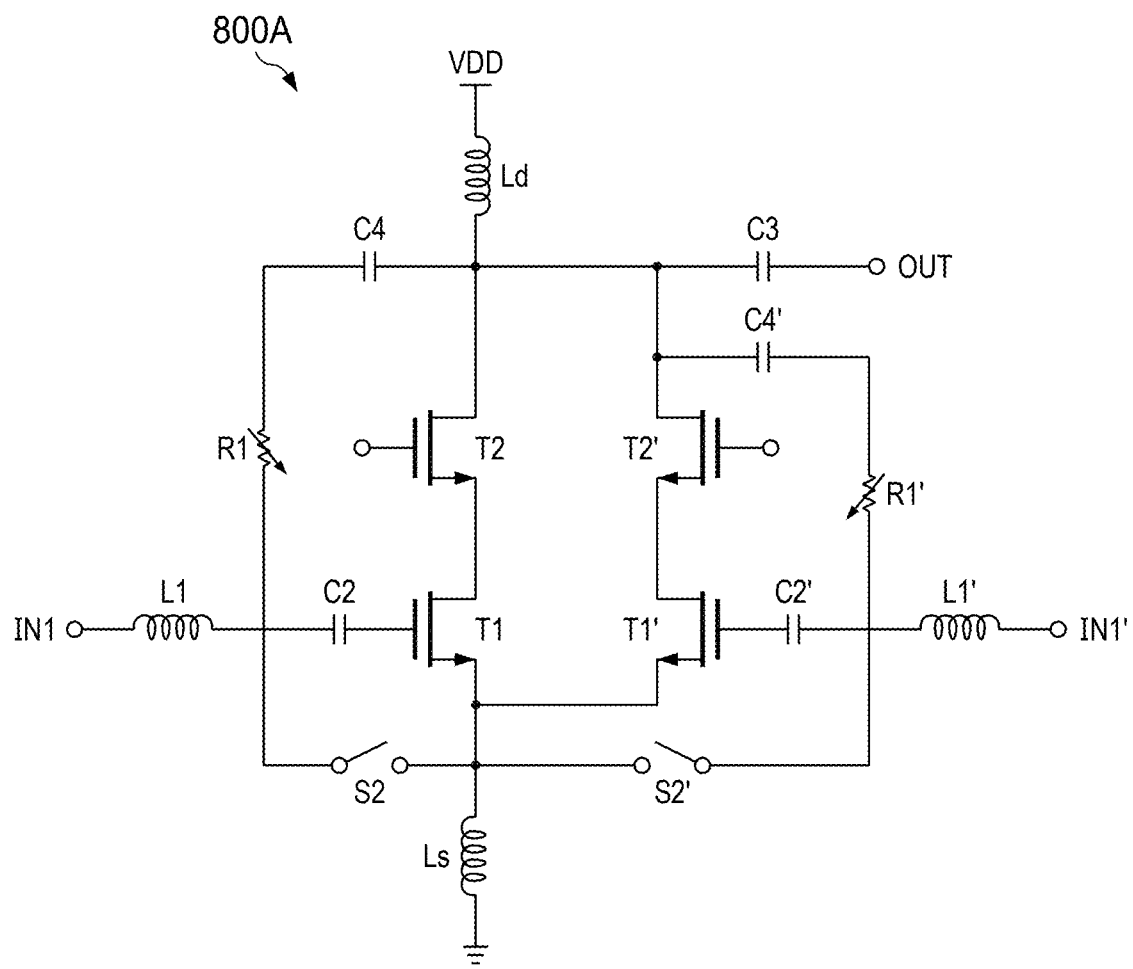
FIGS. 8A-8C show exemplary multi-input LNAs according to embodiments of the present disclosure.

FIG. 7D shows an exemplary LNA (700D) according to an embodiment of the present disclosure. The principle of operation of LNA (700D) of FIG. 7D is similar to the one described above with regards to LNA (700C) of FIG. 7C, except that switch (S3) is now implemented closer to the gate terminal of transistor (T1) instead of being disposed closer to the source terminal of transistor (T1). The location where switch (S3) is disposed depends on the desired isolation and the overall layout of the circuit. In another embodiment, two switches within the feedback path, one closer to the gate terminal of transistor (T1) and the other one closer to the source terminal of transistor (T1) may be implemented for improved isolation The disclosed devices and methods are also applicable to multi-input LNAs. FIG. 8A shows an exemplary LNA (800A) according to a further embodiment of the present disclosure. LNA (800A) has two inputs (IN1, IN1') receiving each their respective inputs during operation. Cascode transistors (T1', T2') are the mirrors of their counterpart cascode transistors (T1, T2). Similarly, elements (L1', R1', C2', C4', S3') are mirrors of their respective counterparts (L1, R1, C2, C4, S3). The principle of operation of LNA (800A) is similar to the one described with regards to LNA (200) of FIG. 2, except that LNA (800A) has two inputs with the same functionality, each receiving its own respective input signal.

Figure 8B:
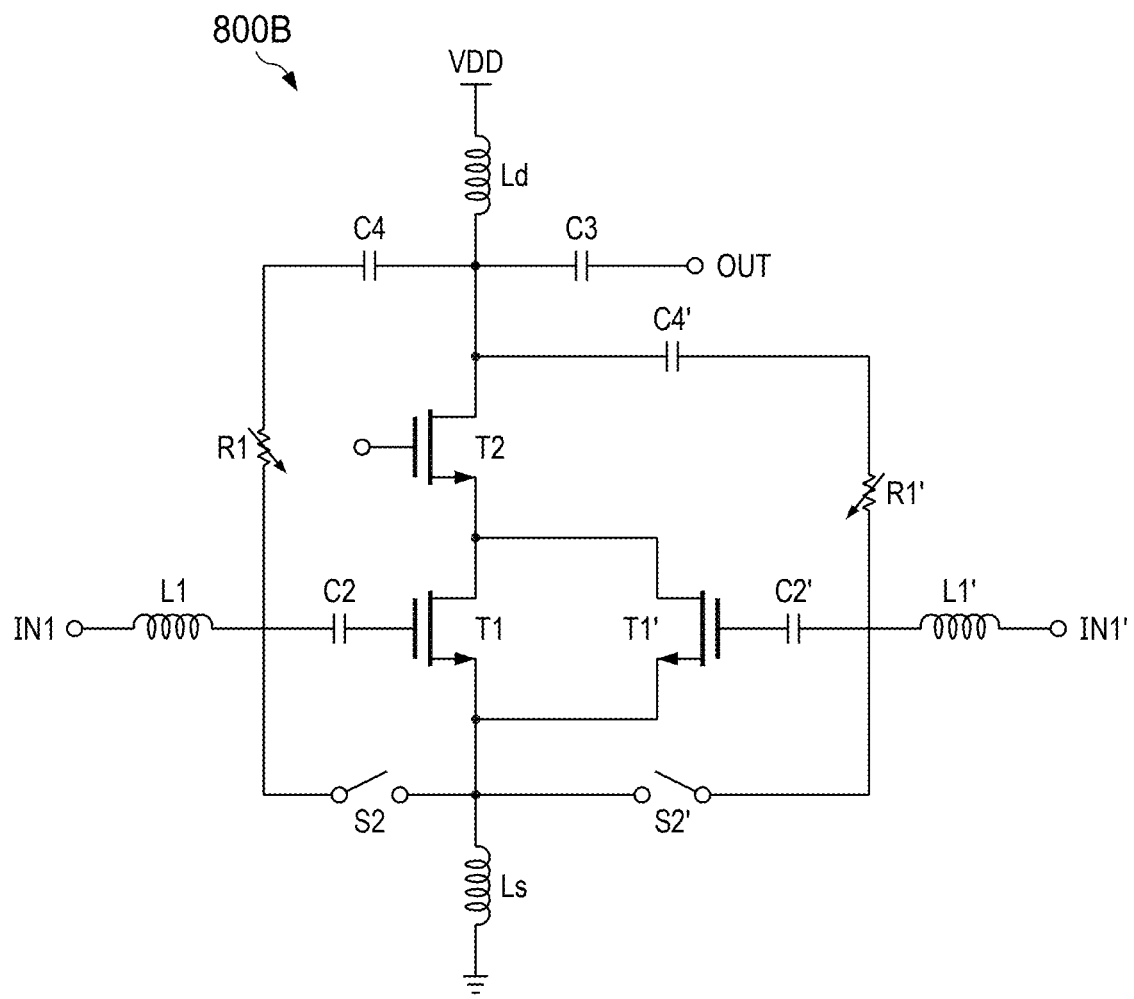

FIG. 8B shows an exemplary LNA (800B) according to a further embodiment of the present disclosure. The functionality of LNA (800B) is similar to the one described with regards to LNA (800A) except that cascode transistor (T2) is now shared between the two inputs IN1 and IN1', as opposed to having a separate cascode transistor for each input. This structure has the benefit of saving more space on the chip due to the absence of an additional cascode transistor and avoiding output loading when many inputs are required.

Figure 8C:
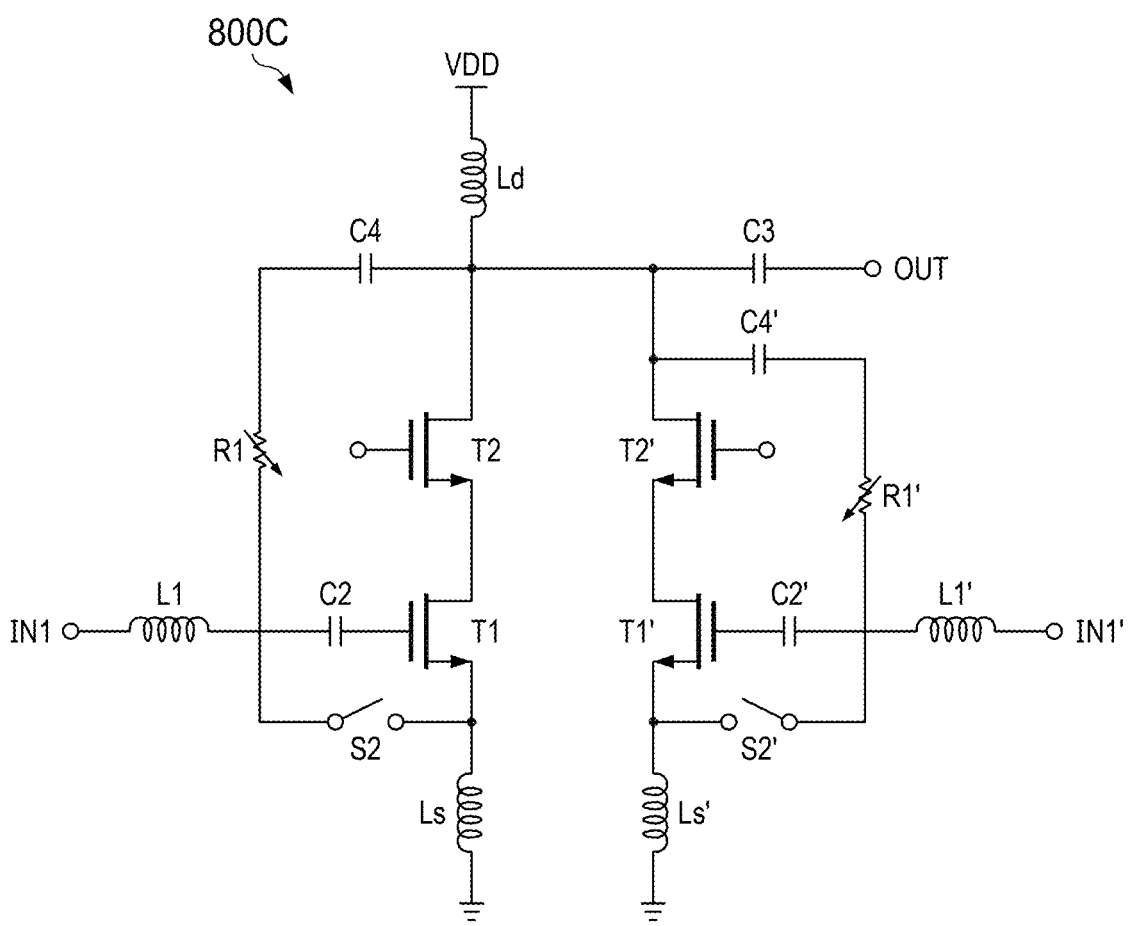

FIG. 8C shows an exemplary LNA (800C) according to yet another embodiment of the present disclosure. The functionality of LNA (800C) is similar to the one described with regards to LNA (800A) of FIG. 8A, except that inductor (Ls) is no longer shared between the two inputs, each input now having its dedicated separate inductor (Ls, Ls').

The disclosed feedback topologies can equally be implemented in LNAs with an arbitrary number of inputs, implementing any of the feedback methods or any combination thereof.

According to the teachings of the present disclosure, in multi-input LNAs, each input may be used one at a time. As such, feedback paths may be shared among various inputs. In what follows embodiments in accordance with the present disclosure and demonstrating such concept will be described in detail.

Figure 9A:
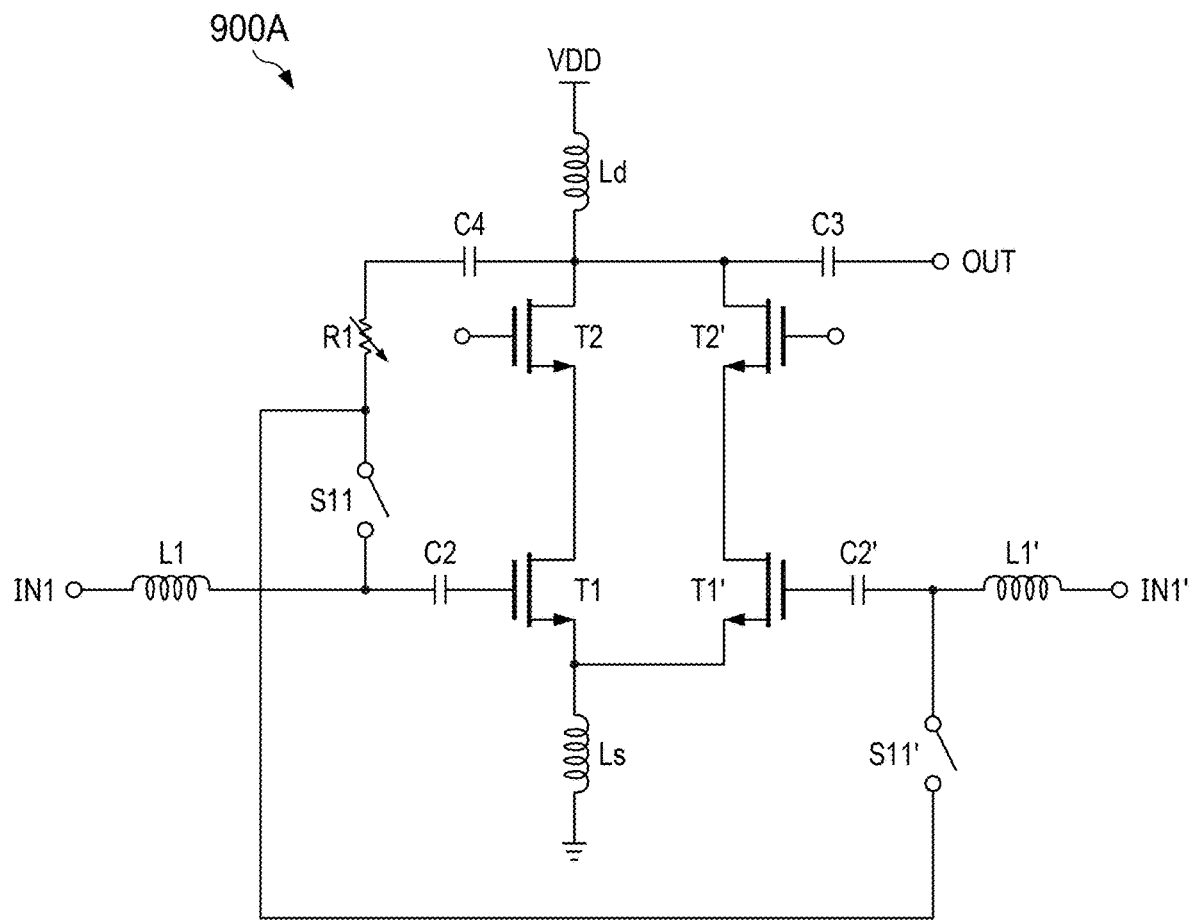
FIG. 9A shows a multi-input LNA.

FIG. 9A shows an exemplary LNA (900A) according to an embodiment of the present disclosure. As can be noticed, LNA (900A) has two inputs (IN1, IN1'), and the feedback path from the drain terminal of transistor (T2) to the gate terminal of transistor (T1) is shared between the two inputs. When input (IN1) is in operation, switch (S11) is in ON state (closed) and switch (S11') is in OFF state (open). As such, the feedback path is used by input (IN1). On the other hand, when input (IN2) is in operation, switch (S11) is in OFF state (open) and switch (S11') is in ON state (closed) and as a result the feedback path is used this time by input (IN1'). The benefit of sharing the feedback among the inputs of a multi-input LNA is to save more space on the chip. According to an embodiment of the present disclosure, when the LNA (900A) is operating in high gain mode, switches (S11, S11') are in OFF state (open).

Figure 9B:
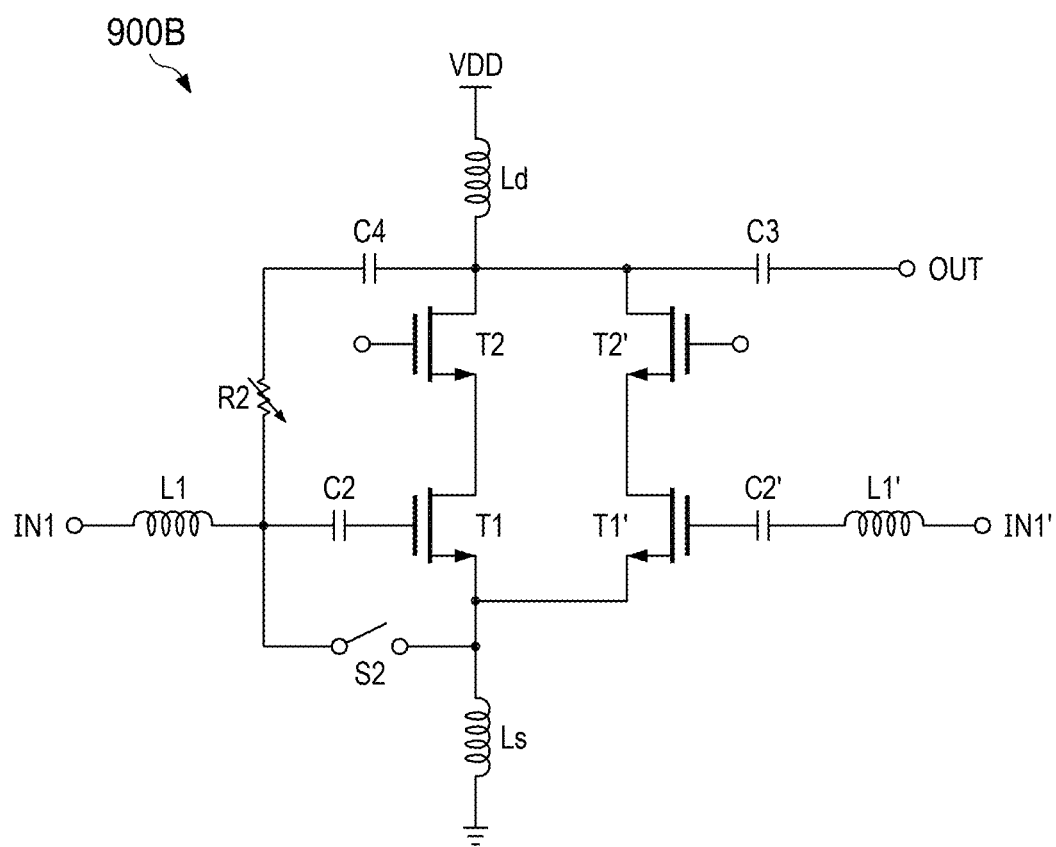
FIGS. 9B-9C show exemplary multi-input LNAs according to embodiments of the present disclosure.

FIG. 9B shows an exemplary LNA (900B) according to an embodiment of the present disclosure. LNA (900B) has two inputs (IN1, IN1'), and the feedback path from the drain terminal of transistor (T2) to the source terminal of transistor (T1) is shared between the two inputs. When switch (S2) is in ON state (closed) the feedback path is switched in. Either one of the inputs (IN1, IN1') can use such feedback path depending on which input is in operation.

Figure 9C:
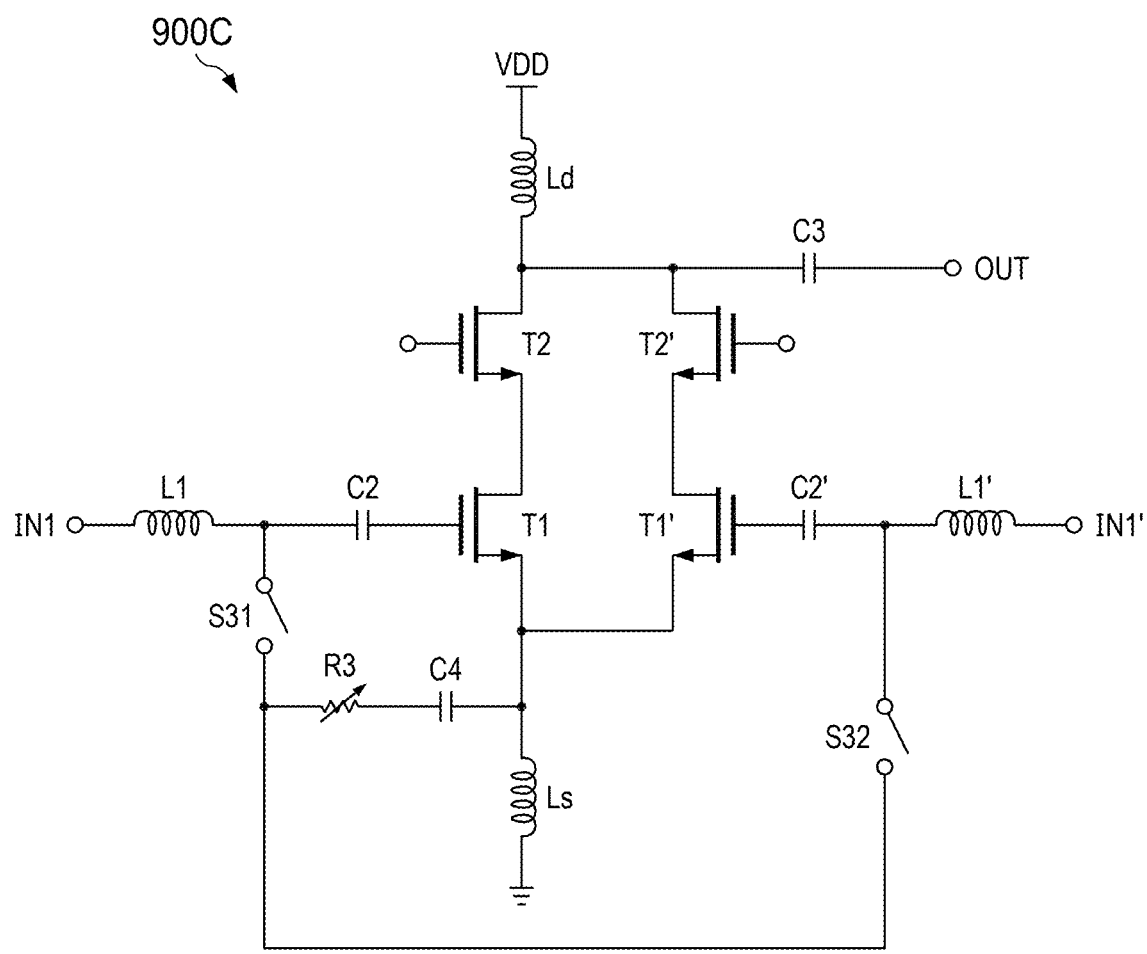

FIG. 9C shows an exemplary LNA (900C) according to a still further embodiment of the present disclosure. LNA (900C) has two inputs (IN1, IN1'), and the feedback path from the gate terminal of transistor (T1) to the source terminal of transistor (T1) is shared between the two inputs. When input (IN1) is in operation, switch (S31) is in ON state (closed) and switch (S31') is in OFF state (open). As such, the feedback path is used by input (IN1). On the other hand, when input (IN2) is in operation, switch (S31) is in OFF state (open) and switch (S31') is in ON state (closed) and, as a result, the feedback path is used this time by input (IN1').

The above disclosed teachings related to FIGS. 9A-9C can be implemented in LNAs with an arbitrary number of inputs.

In summary, for the purpose of exemplary illustration, the embodiment shown throughout the disclosure include two cascode transistors, one arranged in common-source and the other one in common-gate configuration. However, the person skilled in the art will understand that the disclosed teachings are also equally applicable to amplifiers with cascode transistors having more than two transistors and arranged in different configurations. Moreover, some embodiments may only include only one transistor.

The disclosed teachings shown in the above specification and figures are also applicable to other types of RF amplifiers other than LNAs.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies.

However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) amplifier comprising:
one or more transistors being serially connected, wherein a first transistor of the one or more transistors is configured to receive a first input signal from a first input terminal;
a first feedback path including a first programmable resistor coupling a drain terminal of a transistor of the one or more transistors to a source terminal of the first transistor of the one or more of transistors, and
a second feedback path including a second programmable resistor coupling a gate terminal of the first transistor to the source terminal of the first transistor.

2. The RF amplifier of claim 1, wherein the first feedback path further includes a first direct current (DC) blocking capacitor disposed in series with the first programmable resistor.

3. The RF amplifier of claim 2, comprising a switch configured to selectively switch in and out the first feedback path.

4. The RF amplifier of claim 1, further comprising a second DC blocking capacitor arranged in series with the second programmable resistor.

5. The RF amplifier of claim 4, further comprising a switch configured to selectively switch in and out the second feedback path.

6. The RF amplifier of claim 1, further comprising a third feedback path including a third programmable resistor coupling a drain terminal of the one or more transistors to the gate terminal of the first transistor.

7. The RF amplifier of claim 6, further including a third DC blocking capacitor arranged in series with the third programmable resistor.

8. The RF amplifier of claim 6, further comprising a first additional transistor and a second additional transistor, wherein:
a gate terminal of the first additional transistor is connected to the gate terminal of the first transistor;
a source terminal of the first additional transistor is connected to the source terminal of the first transistor, and
a drain terminal of the second additional transistor is connected to a drain terminal of the one or more transistors; and
the source terminal of the second additional transistor is connected to the drain terminal of the first additional transistor.

9. The RF amplifier of claim 6, further comprising a second DC blocking capacitor coupling the drain terminal of the transistor to the first programmable resistor and the third programmable resistor.

10. The RF amplifier of claim 3, wherein the switch is disposed in the first feedback path.

11. The RF amplifier of claim 1, wherein the first input signal is configured to be selected out of a plurality of input signals based on a desired band.

12. The RF amplifier of claim 11, further comprising a series switch within the first feedback path, wherein:
the series switch is configured to switch the first programmable resistor in and out, and
the series switch is disposed either closer to the drain terminal of the transistor or closer to source terminal of the first transistor.

13. The RF amplifier of claim 1, further comprising:
a plurality of additional transistors being serially connected, wherein a first additional transistor of the plurality of additional transistors is configured to receive a second input signal from a second input terminal; and
a third feedback path including a third programmable resistor coupling a drain terminal of a second additional transistor of the plurality of additional transistors to a source terminal of the first additional transistor,
wherein the drain terminal of the first transistor is connected to the drain terminal of the first additional transistor, and wherein the source terminal of the first transistor is connected to the source terminal of the first additional transistor.

14. The RF amplifier of claim 13, wherein the first feedback and the third feedback path are configured to selectively be switched in and out.

15. The RF amplifier of claim 1, further comprising:
an additional transistor configured to receive a second input signal from a second input terminal; and
a third feedback path including a third programmable resistor coupling the drain terminal of the additional transistor to the source terminal of first transistor,
wherein the drain terminal of the first transistor is connected to a drain terminal of the additional transistor, and wherein the source terminal of the first transistor is connected to a source terminal of the additional transistor.

16. The RF amplifier of claim 15, wherein first feedback and the third feedback path are configured to be selectively switched in and out.

17. The RF amplifier of claim 1, further comprising:
one or more additional transistors being serially connected, wherein a first additional transistor of the one or more additional transistors is configured to receive a second input signal from a second input terminal,
wherein the drain terminal of the transistor is connected to a drain terminal of an additional transistor of the one or more additional transistors, and wherein the source terminal of the first transistor is connected to a source terminal of the first additional transistor.

18. The RF amplifier of claim 17, wherein the first feedback path is configured to be selectively switched in and out.

19. A radio frequency (RF) amplifier comprising:
one or more transistors being serially connected, wherein a first transistor of the one or more transistors is configured to receive a first input signal from a first input terminal; and
a first feedback path including a first programmable resistor coupling a gate terminal of the first transistor to a source terminal of the first transistor.

20. The RF amplifier of claim 19, further comprising
i) one or more additional transistors being serially connected, wherein:
a first additional transistor of the one or more additional transistors is configured to receive a second input signal from a second input terminal;

the drain terminal of the transistor is connected to a drain terminal of an additional transistor of the one or more additional transistors, and the source terminal of the first transistor is connected to a source-terminal of the first additional transistor;

ii) a second feedback path coupling:

the source terminal of the first transistor to a gate terminal of the first additional transistor through a second switch.

21. The RF amplifier of claim 20, wherein:

in a first state when the first input terminal is active, the first switch is closed and the second switch is open, and in a second state when the second input terminal is active, the first switch is open and the second switch is closed.

22. The RF amplifier of claim 1, wherein the RF amplifier is a low noise amplifier (LNA).

23. A method of reducing gain in a radio frequency (RF) amplifier, the method comprising:

providing one or more transistors being serially connected;

applying an input signal to a gate terminal of a first transistor of the one or more transistors;

providing a first feedback path including a first programmable resistor, the first feedback path coupling a drain terminal of a transistor of the one or more transistors to the gate terminal of the first transistor;

providing a second feedback path including a second programmable resistor, the second feedback path coupling the drain terminal of the transistor to a source terminal of the first transistor;

providing a third feedback path including a third programmable resistor, the third feedback path coupling the gate-terminal of the first transistor of the one or more transistors to the source-terminal of the first transistor of the one or more transistors;

selectively switching in and out one or more of the first, second, and the third feedback paths based on a set requirement, and further adjusting the gain by varying one or more of the first, second, and the third programmable resistors.

* * * * *